United States Patent
Bean

(10) Patent No.: US 11,373,977 B1
(45) Date of Patent: Jun. 28, 2022

(54) SYSTEM-IN-PACKAGE (SIP) WITH VERTICALLY ORIENTED DIELETS

(71) Applicant: Rockwell Collins, Inc., Cedar Rapids, IA (US)

(72) Inventor: Reginald D. Bean, Center Point, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 17/021,948

(22) Filed: Sep. 15, 2020

(51) Int. Cl.
*H01L 25/065* (2006.01)
*H01L 23/498* (2006.01)
*H01L 23/538* (2006.01)
*H01L 23/31* (2006.01)
*H01L 23/00* (2006.01)

(52) U.S. Cl.
CPC ...... *H01L 25/0652* (2013.01); *H01L 23/3157* (2013.01); *H01L 23/49816* (2013.01); *H01L 23/49827* (2013.01); *H01L 23/5384* (2013.01); *H01L 24/13* (2013.01); *H01L 2924/1431* (2013.01)

(58) Field of Classification Search
CPC ................................................. H01L 25/0652
See application file for complete search history.

(56) References Cited

U.S. PATENT DOCUMENTS

| | | | |
|---|---|---|---|
| 5,544,017 A | 8/1996 | Beilin et al. | |
| 6,147,411 A * | 11/2000 | Kinsman | H01L 25/0657 257/777 |
| 7,367,845 B2 | 5/2008 | Farnworth et al. | |
| 8,390,109 B2 | 3/2013 | Popovic et al. | |
| 8,772,920 B2 | 7/2014 | Thacker et al. | |
| 9,365,749 B2 | 6/2016 | Khanna | |
| 9,478,524 B2 | 10/2016 | Cheah et al. | |
| 9,777,197 B2 | 10/2017 | Khanna | |
| 9,812,425 B2 | 11/2017 | Cheah et al. | |
| 10,020,219 B2 | 7/2018 | Cook et al. | |
| 10,403,577 B1 | 9/2019 | Huang et al. | |
| 10,453,833 B2 | 10/2019 | Pagani | |
| 2012/0106111 A1 | 5/2012 | Mazzochette et al. | |
| 2016/0254244 A1 | 9/2016 | Khanna | |
| 2017/0084577 A1 | 3/2017 | Carney et al. | |
| 2018/0040587 A1 * | 2/2018 | Tao | H01L 24/24 |

FOREIGN PATENT DOCUMENTS

WO 2020036631 A9 4/2020

OTHER PUBLICATIONS

Pristauz, Hugo et al., "Disruptive Developments for Advanced Die Attach to Tackle the Challenges of Heterogeneous Integration", IEEE 68th Electronic Components and Technology Conference, May 2018, San Diego, 9 pages.

* cited by examiner

*Primary Examiner* — William A Harriston
(74) *Attorney, Agent, or Firm* — Suiter Swantz pc llo

(57) ABSTRACT

A system-in-package (SiP) incorporating] is disclosed. In embodiments, the host die defines a substantially horizontal plane (e.g., via its active side). One or more vertical dielets are attached to, and interconnected with, the active side of the host die in a substantially vertical configuration (e.g., perpendicular to the host die). Due to the perpendicular orientation of the dielets, the SiP incorporates thermal spreaders in thermal contact with the active side of the host die as well as the inactive sides of the dielets, allowing for thermal dissipation from the host dies and dielets without the need for through silicon vias.

12 Claims, 6 Drawing Sheets

SYSTEM-IN-PACKAGE (SIP) WITH VERTICALLY ORIENTED DIELETS

BACKGROUND

As logic density increases, the footprint required for logic functions decreases in size. This enables the incorporation of more dies into a single system-in-package (SiP), but two types of challenges remain: thermal issues and interconnection issues. Conventional SiP incorporating multiple dies tend to stack the dies or chips in a configuration where the plane of each die is parallel to each other. As heat tends to be dissipated vertically (e.g., conductively through the top of a horizontally oriented SiP), adequate thermal conductivity may be lacking due to a shortage of thermal paths. Vertical through silicon vias may be used to electrically connect horizontal chip layers within the SiP, but vias may be difficult to manufacture and consume die area that could otherwise be devoted to logic, increasing die size generally.

SUMMARY

A system-in-package (SiP) is disclosed. In embodiments, the SiP includes a host die having a logic side (e.g., logic face, active side) defining a substantially horizontal plane. The SiP includes one or more dielets (e.g., smaller or auxiliary dies or logic devices) also having a logic side (and a bulk silicon side opposite the logic side), but oriented vertically such that the logic and bulk sides of the dielets are perpendicular to the logic side of the host die, and each dielet has a lateral edge adjacent to the logic side of the host die. Each dielet is connected to the logic side of the host die via the dielet active side (e.g., by die-level interconnect structures). The bulk sides of the dielets, as well as the uncovered portions of the logic side of the host die, are surrounded by thermal spreader materials to allow efficient heat dissipation through the dielets and host die.

In some embodiments, the lateral edges of the dielets are connected to the logic side of the host die by additional die-level interconnect structures.

In some embodiments, the host die may include additional perimeter bumps or die-level interconnect structures beyond the dielets and thermal spreader materials.

In some embodiments, the die-level interconnect structures include thermocompression bonded conductive materials.

In some embodiments, the die-level interconnect structures include conductive materials added by three-dimensional (3D) additive printing.

In some embodiments, the SiP includes additional dielets connected to the vertical dielets (e.g., via the bulk sides of the vertical dielets).

A SiP incorporating one or more silicon interposers is also disclosed. In embodiments, the SiP includes a host die having a logic side defining a substantially horizontal plane. The interposer/s is/are oriented vertically (e.g., perpendicular to the logic side) and have a lateral edge adjacent to the logic side. The interposer may be connected to the logic side of the host die by die-level interconnect structures, e.g., via a first side or face of the interposer. The SiP includes one or more vertical dielets, each dielet having a logic/active side and a bulk/inactive side. Each dielet active side is connected to the interposer by die-level interconnect structures (and connected to the logic side of the host die via, e.g., through silicon vias within the interposer). The logic side of the host die and the bulk sides of the dielets are surrounded by thermal spreader materials to allow for heat dissipation through the host die and dielets.

In some embodiments, the dielet or dielets is/are connected to the interposer via a face or side of the interposer opposite the face or side of the interposer connected to the logic side of the host die.

In some embodiments, the dielet or dielets is/are connected to both sides or faces of the interposer.

A SiP based on a host interposer is also disclosed. In embodiments, the SiP incorporates as a host die an interposer having no active logic, having a first or "top" side or face and an opposing side or face, both sides or faces defining a substantially horizontal plane. One or more vertical dielets, each having a dielet active (e.g., logic) side and a dielet inactive (e.g., bulk) side, are oriented substantially perpendicular to the host interposer, each dielet having a lateral edge adjacent to the top side of the interposer. Each dielet is connected to the host interposer via die-level interconnect structures connecting the dielet active side to the top side of the interposer. The top side of the interposer and the inactive sides of the vertical dielets are connected to thermal spreaders for heat dissipation from the dielets.

In some embodiments, the SiP includes a host die with active logic connected to the opposing side of the host interposer via die-level interconnect structures connected to the active (e.g., logic) side of the host die.

This Summary is provided solely as an introduction to subject matter that is fully described in the Detailed Description and Drawings. The Summary should not be considered to describe essential features nor be used to determine the scope of the Claims. Moreover, it is to be understood that both the foregoing Summary and the following Detailed Description are example and explanatory only and are not necessarily restrictive of the subject matter claimed.

BRIEF DESCRIPTION OF THE DRAWINGS

The detailed description is described with reference to the accompanying figures. The use of the same reference numbers in different instances in the description and the figures may indicate similar or identical items. Various embodiments or examples ("examples") of the present disclosure are disclosed in the following detailed description and the accompanying drawings. The drawings are not necessarily to scale. In general, operations of disclosed processes may be performed in an arbitrary order, unless otherwise provided in the claims. In the drawings:

DETAILED DESCRIPTION

Figure 1:
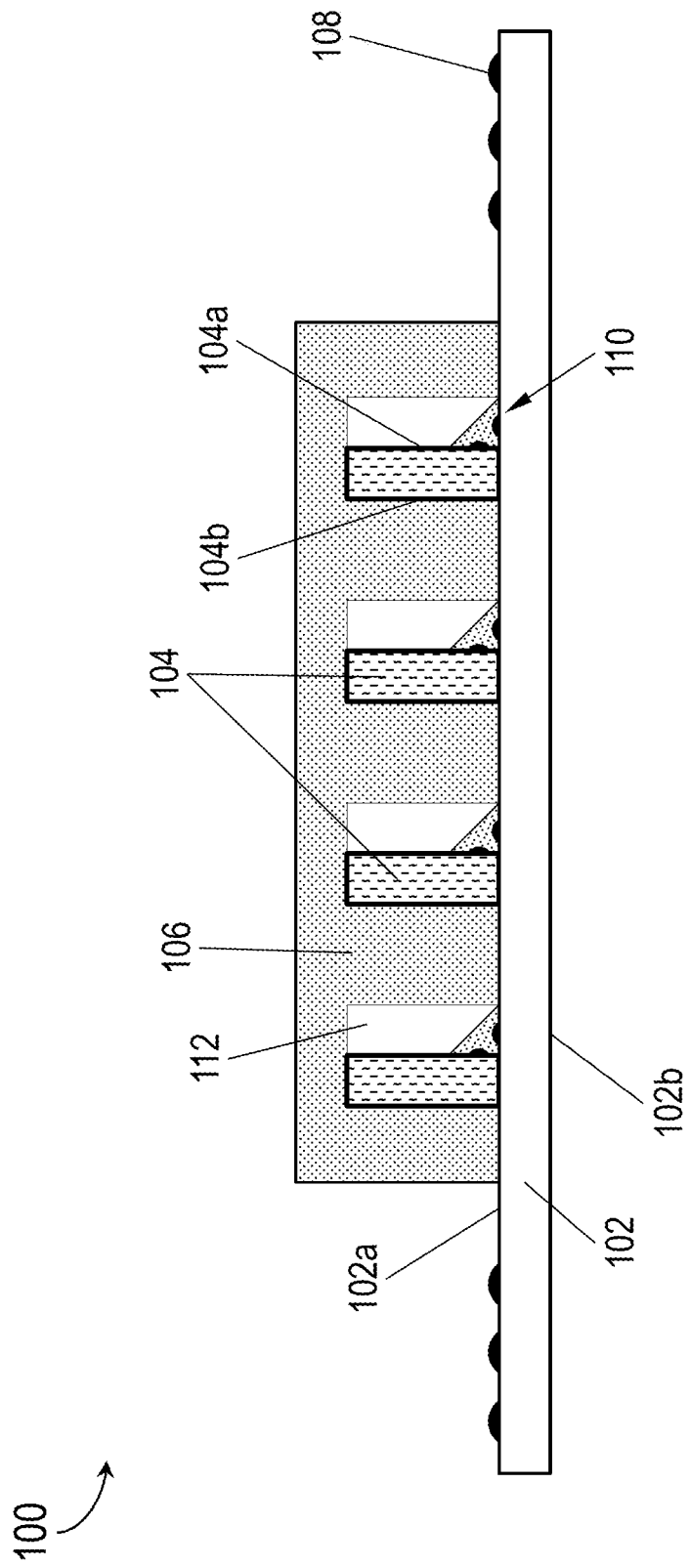
FIG. 1 is a diagrammatic illustration of a system-in-package (SiP) according to example embodiments of this disclosure.

Before explaining one or more embodiments of the disclosure in detail, it is to be understood that the embodiments are not limited in their application to the details of construction and the arrangement of the components or steps or methodologies set forth in the following description or illustrated in the drawings. In the following detailed description of embodiments, numerous specific details may be set forth in order to provide a more thorough understanding of the disclosure. However, it will be apparent to one of ordinary skill in the art having the benefit of the instant disclosure that the embodiments disclosed herein may be practiced without some of these specific details. In other instances, well-known features may not be described in detail to avoid unnecessarily complicating the instant disclosure.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination or sub-combination of two or more such features, along with any other features which may not necessarily be expressly described or inherently present in the instant disclosure.

Broadly speaking, embodiments of the inventive concepts disclosed herein are directed to a SiP configuration that provides vertical interconnection but eliminates the need for through silicon vias by arranging a host die in the vertical plane and configuring interconnected dies or dielets in the vertical plane. In this way, contact between both the host and vertical dies with thermal spreaders can be maximized, providing good thermal conductivity as well as overall package rigidity.

Referring to FIG. 1, a system-in-package 100 (SiP) is disclosed. The SiP 100 includes a host die 102, vertically oriented dielets 104, and thermal spreaders 106 (e.g., thermal dissipation material).

In embodiments, the host die 102 may be oriented with its active side (102a; active face, logic side) facing upward and its inactive side (102b; inactive face) (e.g., bulk silicon side) facing downward. For example, the host die may include die-level interconnect devices 108 (e.g., perimeter bumps) at the edges of the active side 102a (e.g., for host input/output (I/O) and power/grounding functionality). The dielets 104 may include (but are not limited to) memory units, microcontrollers, and other programmable logic devices.

In embodiments, the dielets 104 may be arranged vertically, or substantially perpendicular to the host die 102. For example, each dielet 104 may have a dielet active side 104a and a dielet inactive side 104b (e.g., bulk silicon side). The dielet active side 104a of each dielet may be interconnected with the host active side 102a of the host die 102 through a variety of interconnect configurations (110) as described below.

In embodiments, the thermal spreaders 106 may include any appropriate thermally conductive material. For example, the dielets 104 may be fixed in place relative to the host die 102 and interconnected thereto, and the thermal spreaders applied over the dielets and host die prior to curing of the SiP 100, such that the thermal spreaders maintain sufficient contact with the active side 102a of the host die 102 to provide thermal dissipation from the host die through the active side. At the same time, the thermal spreaders 106 may be in full or near full contact with the dielet inactive sides 104b of the dielets 104, providing added rigidity to the dielets as well as thermal dissipation therefrom. For example, thermal dissipation through the thermal spreaders 106 from the host die 102 and dielets 104 may be sufficient as to eliminate the need for thermal transfer through the host inactive side 102b of the host die 102 as well as the need for through silicon vias. In some embodiments, thermal fillers 112 (e.g., dielectric and/or thermally conductive greases, pastes, or other filler materials) may bridge any gaps between the thermal spreaders 106 and the host die 102 and/or the dielets 104.

Figure 2:
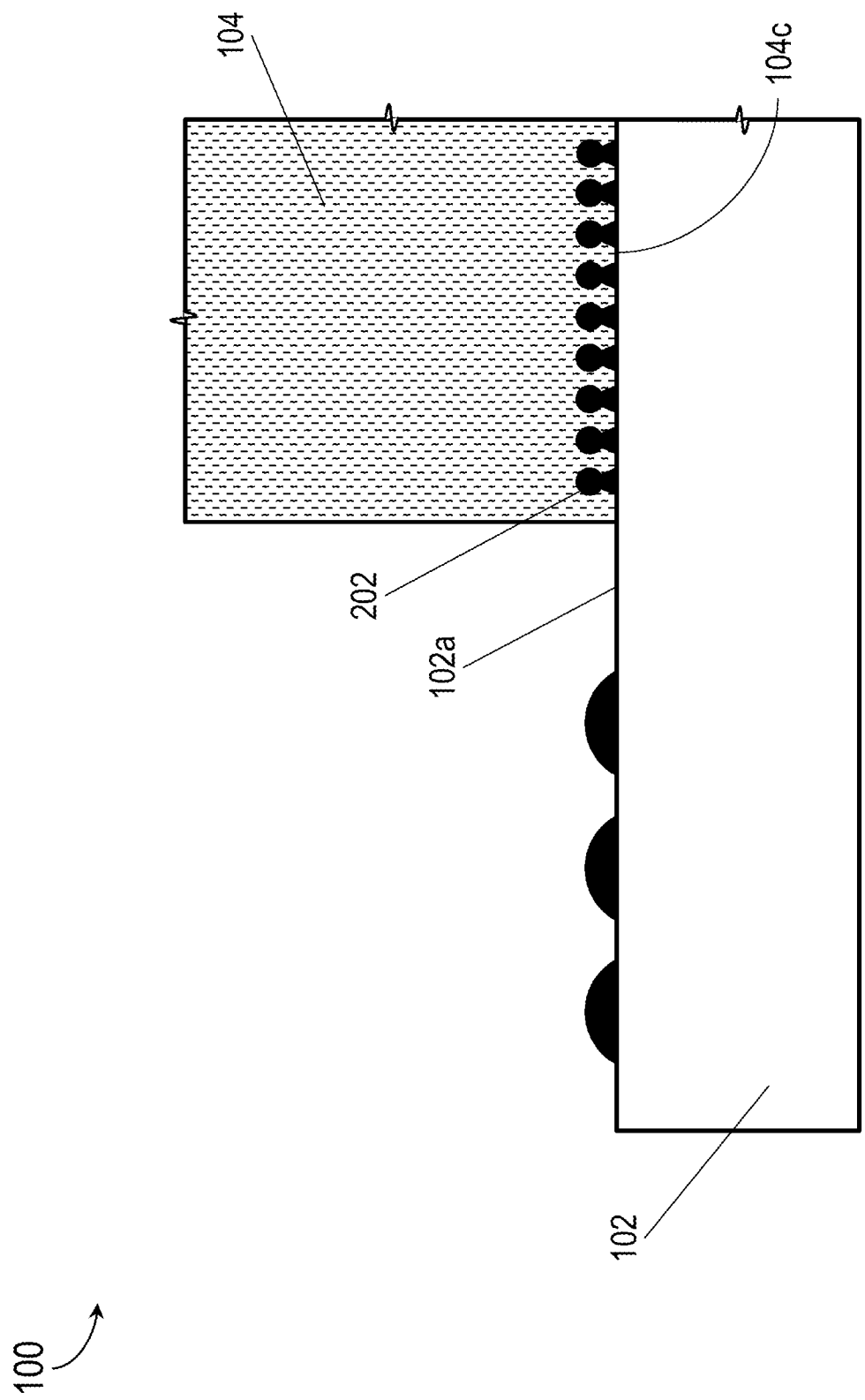
FIG. 2 is a diagrammatic illustration of alternative interconnections of the SiP of FIG. 1.

Referring now to FIG. 2, the SiP 100 is disclosed.

In embodiments, each vertical dielet 104 may further be interconnected with the active side 102a of the host die 102 via a series of internal interconnect devices 202 (e.g., internal bumps) set into a lateral edge 104c of the dielet.

Figure 3:
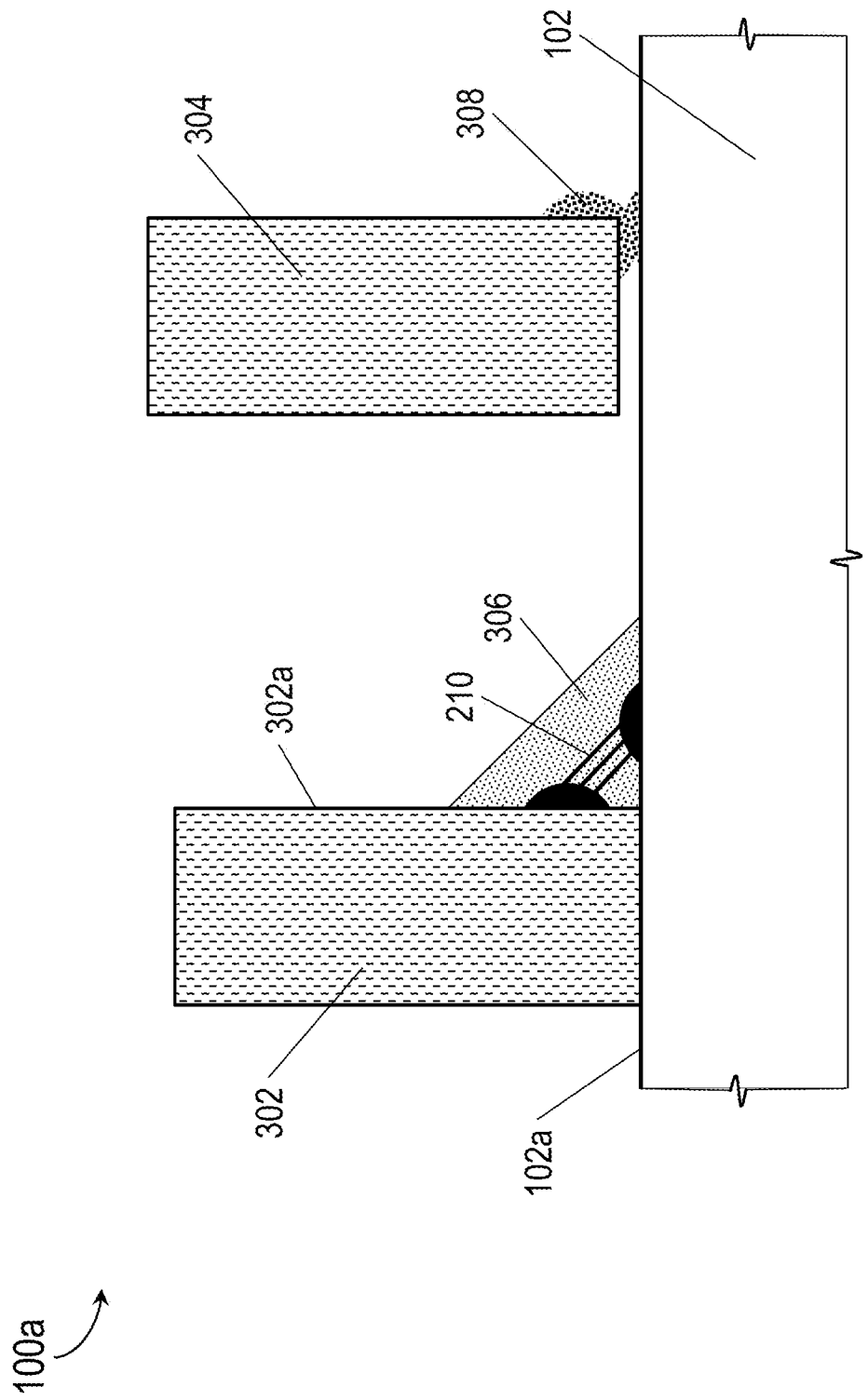
FIG. 3 is a diagrammatic illustration of the SiP of FIG. 1.

Referring now to FIG. 3, the SiP 100a and vertical dielets 302, 304 may be implemented and may function similarly to the SiP 100 and vertical dielets 104 of FIG. 1, except that the dielets 302, 304 of the SiP 100a may incorporate various means of interconnection to the host die 102. For example, the dielet 302 may be connected to the host die 102 through its active side 302a, e.g., via an anisotropic conductive adhesive 306 or like conductive adhesive. When cured, conductive z-axis columns 210 may form through the conductive adhesive 306, creating z-axis electrical interconnections while maintaining electrical insulation in the x/y (e.g., horizontal) plane of the active side 102a of the hose die 102. In some embodiments, magnetic fields may be applied prior to curing to draw the z-axis columns 210 off the z-axis (e.g., to an angle other than vertical), allowing right-angle connectivity between the host die 102 and the dielet 302.

In embodiments, the dielet 304 may similarly be configured for right-angle connectivity to the host die 102 via thermocompression bonding of solder 308 or other conductive metallic materials. In some embodiments, the dielet 304 may be bonded to the host die 102 via an adhesive, and conductive interconnections (e.g., z-axis columns 210) added via jet aerosol printer or like three-dimensional additive manufacturing (e.g., 3D printing).

Figure 4:
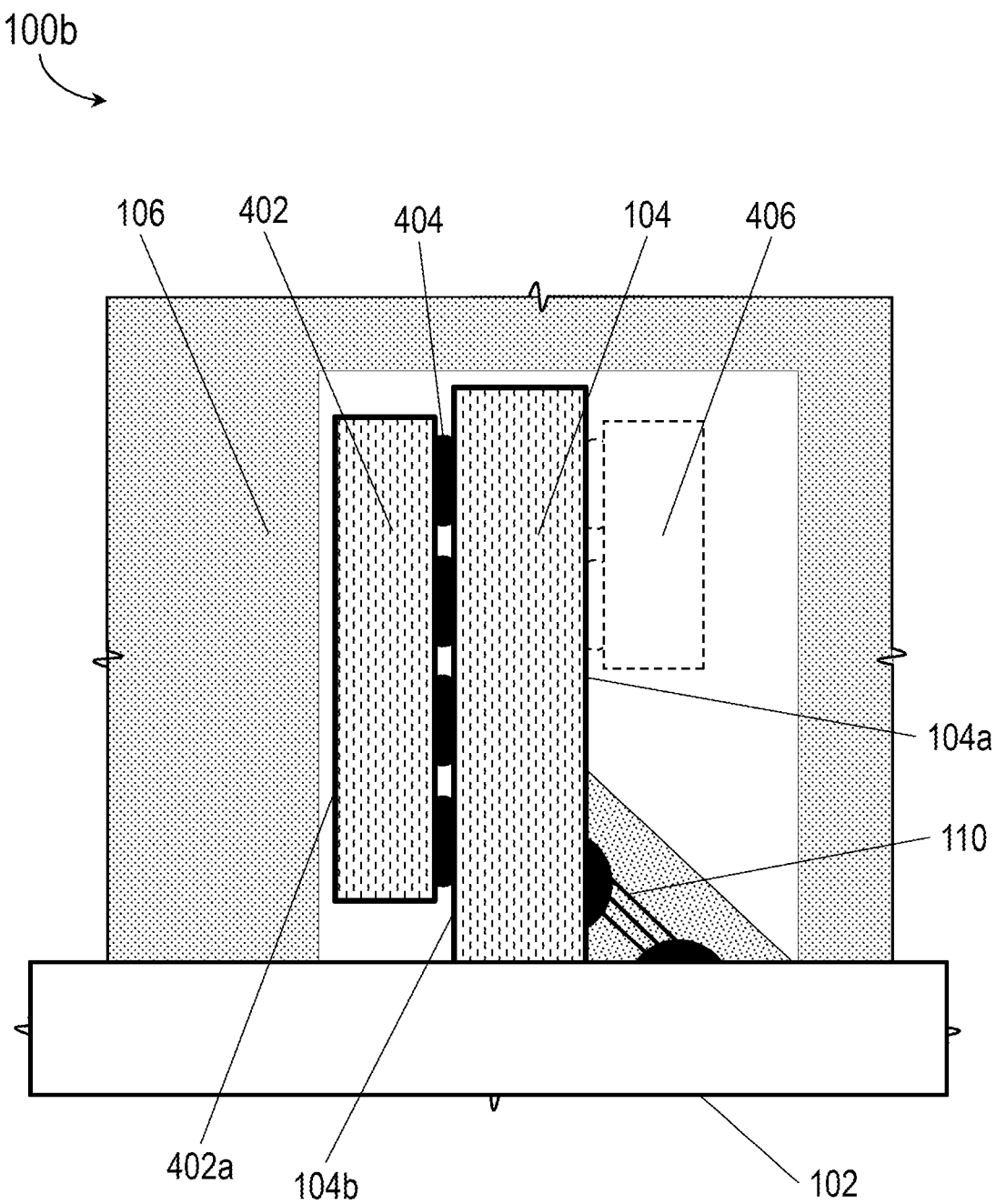
FIG. 4 is a diagrammatic illustration of the SiP of FIG. 1 incorporating stacked dielets.

Referring now to FIG. 4, the SiP 100b may be implemented and may function similarly to the SiPs 100, 100a of FIGS. 1 through 2B, except that the SiP 100b may incorporate a stacked dielet 402 interconnected with one or more vertical dielets 104 (e.g., via bumps 404 or other like die-level interconnect devices).

In embodiments, the stacked dielet 402 may be connected to the dielet inactive side 104b (e.g., bulk silicon side) of the vertical dielet 104 by its dielet active side 402a (e.g., logic side) via through silicon vias (not shown). For example, the stacked dielet 402 may dissipate heat via the thermal spreaders 106 through its inactive side 402*b* (e.g., bulk silicon side, the side not interconnected with the vertical dielet 104), while the vertical dielet may dissipate heat through the portion of its dielet active side 104*a* (e.g., the side not interconnected with the stacked dielet 402) not interconnected (110) with the host die 102. In some embodiments, a stacked dielet may be connected (406) to the dielet active side 104*a* of the vertical dielet 104.

Figure 5A:
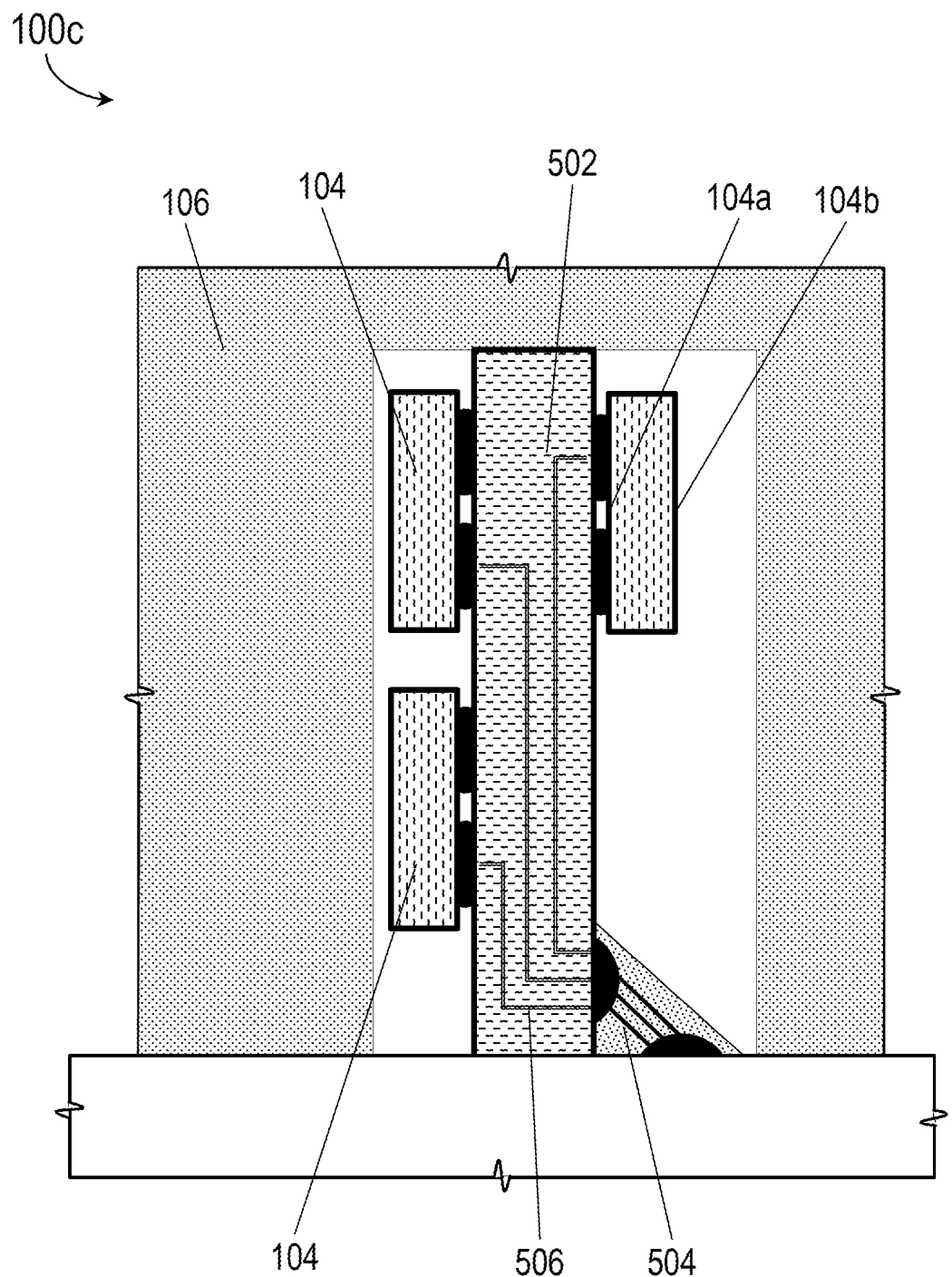
FIG. 5A is a diagrammatic illustration of the SiP of FIG. 1 incorporating a vertical interposer.

Referring to FIG. 5A, the SiP 100*c* may be implemented and may function similarly to the SiP 100, 100*a-b* of FIGS. 1-3, except that the SiP 100*c* may incorporate one or more interposers 502 (e.g., silicon interposers) vertically mounted to the host die 102.

In embodiments, the interposer 502 may be interconnected (504) to the host die in any appropriate fashion as described above and may support one or more vertical dielets 104 interconnected to either side of the interposer. For example, the vertical dielets 104 may be connected to the interposer 502 via their active sides 104*a*, allowing for thermal dissipation through their inactive sides 104*b* via the thermal spreaders 106. The interposer 502 may include routing and interconnections for the vertical dielets 104 connected thereto (e.g., through silicon vias (506)), but may incorporate no active logic or an active side (e.g., the active side 102*a*, FIG. 1).

Figure 5B:
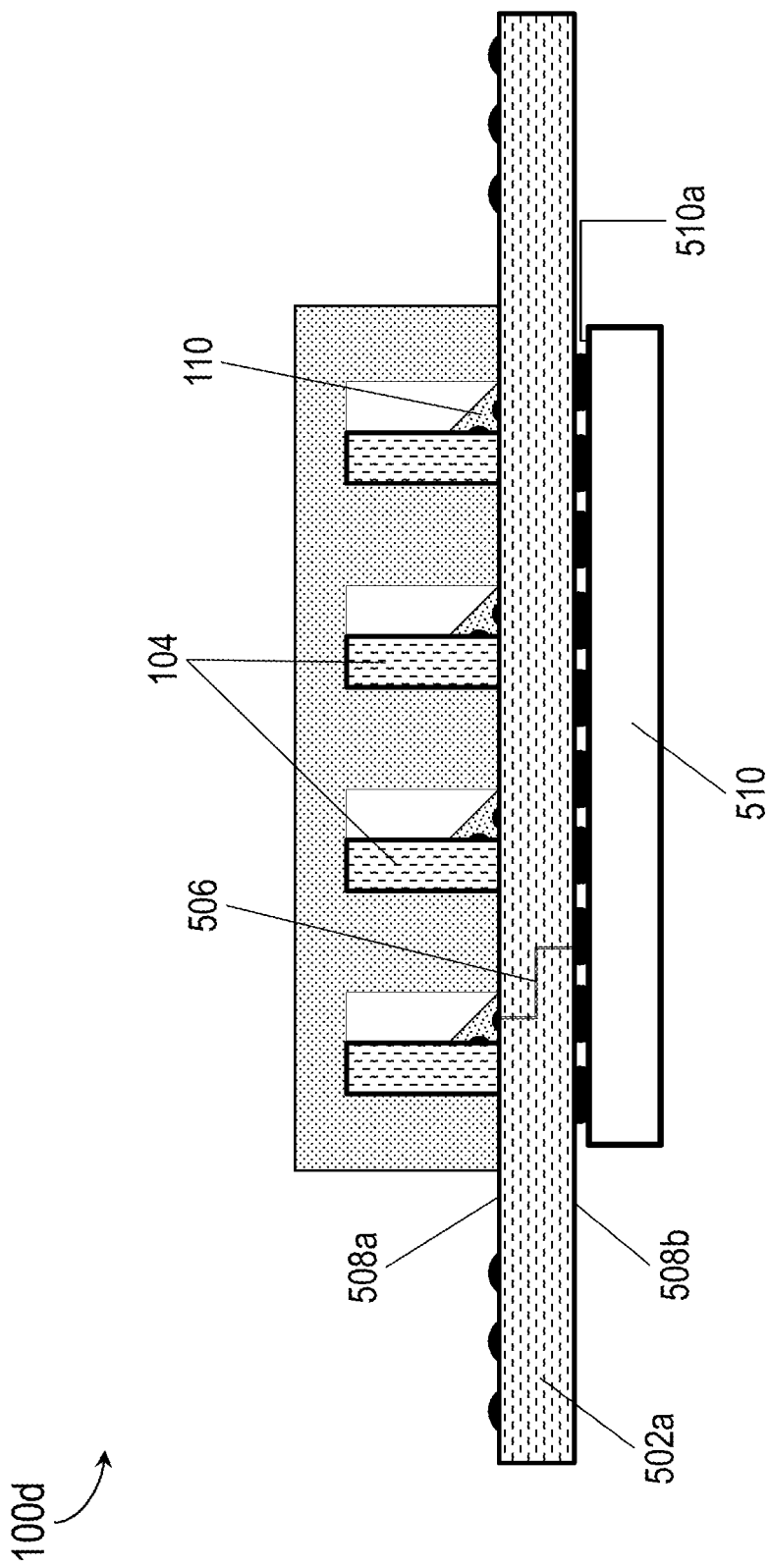
FIG. 5B is a diagrammatic illustration of the SiP of FIG. 1 incorporating a host interposer.

Referring now to FIG. 5B, the SiP 100*d* may be implemented and may function similarly to the SiP 100, 100*a-c* of FIGS. 1 through 5A, except that the SiP 100*d* may incorporate as a host die a host interposer 502*a*.

In embodiments, the vertical dielets 104 may be mounted to one side or face (508*a*) of the host interposer 502*a*, which may (similarly to the interposer 502 of FIG. 5A) include routing and interconnections for the vertical dielets 104 but may include no active logic of its own. In some embodiments, the SiP 100*d* may include an additional host die 510 which may be implemented and may function similarly to the host die 102 of FIG. 1, except that the host die 510 may be mounted to the opposite side (508*b*) of the host interposer 502*a* (e.g., the side or face opposite the side to which the vertical dielets 104 are interconnected (110)) and interconnected to the host interposer by die-level interconnects 108 via its active side 510*a* (e.g., and to the vertical dielets by through silicon vias 506).

CONCLUSION

It is to be understood that embodiments of the methods disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

Although inventive concepts have been described with reference to the embodiments illustrated in the attached drawing figures, equivalents may be employed and substitutions made herein without departing from the scope of the claims. Components illustrated and described herein are merely examples of a system/device and components that may be used to implement embodiments of the inventive concepts and may be replaced with other devices and components without departing from the scope of the claims. Furthermore, any dimensions, degrees, and/or numerical ranges provided herein are to be understood as non-limiting examples unless otherwise specified in the claims.

I claim:

1. A system-in-package (SiP), comprising:
a host die having a host active side defining a plane;
at least one dielet having a dielet active side and a dielet inactive side, the dielet oriented substantially perpendicular to the plane and having a dielet edge adjacent to the host active side, the dielet active side operatively coupled to the host active side via at least one die-level interconnect structure;
and
at least one thermal dissipation material thermally coupled to the host active side and the dielet inactive side, the at least one thermal dissipation material encapsulating the at least one dielet such that the at least one dielet is disposed between the at least one thermal dissipation material and the host die.

2. The SiP of claim 1, wherein the at least one die-level interconnect structure is a first die-level interconnect structure, and:
the dielet edge and the host active side are interconnected via one or more second die-level interconnect structures.

3. The SiP of claim 1, wherein the at least one die-level interconnect structure is a first die-level interconnect structure, further comprising:
a plurality of second die-level interconnect structures attached to the host active side, each second die-level interconnect structure configured for providing an operating connection to the host die.

4. The SiP of claim 1, wherein the at least one die-level interconnect structure includes one or more conductive materials configured to have a shape that is capable of being formed by thermocompression bonding.

5. The SiP of claim 1, wherein the at least one die-level interconnect structure includes one or more conductive materials configured to have a shape that is capable of being three-dimensionally (3D) printed.

6. The SiP of claim 1, wherein the at least one dielet is a first dielet and the at least one die-level interconnect structure is a first die-level interconnect structure, further comprising:
at least one second dielet substantially perpendicular to the plane, the at least one second dielet operatively coupled to the first dielet via one or more second die-level interconnect structures.

7. The SiP of claim 1, further comprising:
a thermal filler disposed between the at least one dielet and the at least one thermal dissipation material, the thermal filler thermally coupled to the dielet active side and the at least one thermal dissipation material.

8. A system-in-package (SiP), comprising:
a host die having a host active side defining a plane;
at least one interposer oriented substantially perpendicular to the plane and having an interposer edge adjacent to the host die, the at least one interposer operatively coupled to the host die via at least one first die-level interconnect structure;
at least one dielet having a dielet active side and a dielet inactive side, the dielet active side operatively coupled to the interposer via at least one second die-level interconnect structure;
and
at least one thermal dissipation material thermally coupled to the host active side and the at least one dielet inactive side, the at least one thermal dissipation material encapsulating the at least one dielet and the interposer such that the at least one dielet and the interposer are disposed between the at least one thermal dissipation material and the host die.

9. The SiP of claim 8, wherein:

the at least one interposer is operatively coupled to the host die via at least one first die-level interconnect structure on a first side substantially perpendicular to the plane;

and the at least one dielet active side is operatively coupled to the interposer on a second side of the interposer, the second side opposing the first side.

10. The SiP of claim 8, wherein the at least one dielet is a first dielet, further comprising:

at least one second dielet having a second dielet active side and a second dielet inactive side, the at least one second dielet active side operatively coupled to the interposer on the first side.

11. A system-in-package (SiP), comprising:

a host interposer having a first side defining a plane and a second side opposite the first side;

at least one dielet having a dielet active side and a dielet inactive side, the dielet oriented substantially perpendicular to the host interposer and having a dielet edge adjacent to the host interposer, the dielet active side operatively coupled to the first side via at least one die-level interconnect structure;

and at least one thermal dissipation material thermally coupled to the first side and the dielet inactive side, the at least one thermal dissipation material encapsulating the at least one dielet such that the at least one dielet is disposed between the at least one thermal dissipation material and the first side.

12. The SiP of claim 11, further comprising:

at least one die having a logic side and a bulk silicon side, the logic side operatively coupled to the second side of the host interposer via at least one second die-level interconnect structure.

* * * * *